(12) United States Patent
Landis et al.

(10) Patent No.: US 11,038,739 B1
(45) Date of Patent: Jun. 15, 2021

(54) SET PARTITIONING FOR A DIGITAL POST DISTORTION RECEIVER

(71) Applicant: QUALCOMM Incorporated, San Diego, CA (US)

(72) Inventors: Shay Landis, Hod Hasharon (IL); Amit Bar-Or Tillinger, Tel-Aviv (IL); Assaf Touboul, Netanya (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/109,975

(22) Filed: Dec. 2, 2020

(51) Int. Cl.
*H04L 27/38* (2006.01)
*H04B 1/10* (2006.01)
*H04L 1/00* (2006.01)
*H04B 17/309* (2015.01)

(52) U.S. Cl.
CPC ............ *H04L 27/38* (2013.01); *H04B 1/1027* (2013.01); *H04B 17/309* (2015.01); *H04L 1/0047* (2013.01)

(58) Field of Classification Search
CPC ...... H04L 27/38; H04L 1/0047; H04B 17/309; H04B 1/1027
See application file for complete search history.

(56) References Cited

U.S. PATENT DOCUMENTS

2007/0143654 A1* 6/2007 Joyce ................. H03M 13/1185
714/752

* cited by examiner

*Primary Examiner* — Curtis B Odom
(74) *Attorney, Agent, or Firm* — Harrity & Harrity, LLP

(57) ABSTRACT

Various aspects of the present disclosure generally relate to wireless communication. In some aspects, a wireless communication device may receive a wireless communication signal. The wireless communication device may process the wireless communication signal using a digital post distortion receiver based at least in part on performing a multi-level coding (MLC) set partitioning operation, wherein performing the MLC set partitioning operation comprises partitioning a quadrature amplitude modulation constellation set by bounding a maximum Euclidean distance of an error associated with decoding one or more least significant bits. Numerous other aspects are provided.

30 Claims, 8 Drawing Sheets

Receive a wireless communication signal

Process the wireless communication signal using a digital post distortion receiver based at least in part on performing a multi-level coding (MLC) set partitioning operation, wherein performing the MLC set partitioning operation comprises partitioning a quadrature amplitude modulation (QAM) constellation set by bounding a maximum Euclidean distance of an error associated with decoding one or more least significant bits

SET PARTITIONING FOR A DIGITAL POST DISTORTION RECEIVER

FIELD OF THE DISCLOSURE

Aspects of the present disclosure generally relate to wireless communication and to techniques and apparatuses for set partitioning for a digital post distortion receiver.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a New Radio (NR) BS, a 5G Node B, or the like.

The above multiple access technologies have been adopted in various telecommunication standards to provide a common protocol that enables different user equipment to communicate on a municipal, national, regional, and even global level. New Radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

In some aspects, a wireless communication device for wireless communication includes a memory and one or more processors coupled to the memory, the memory and the one or more processors configured to receive a wireless communication signal; and process the wireless communication signal using a digital post distortion receiver based at least in part on performing a multi-level coding (MLC) set partitioning operation, wherein performing the MLC set partitioning operation comprises partitioning a quadrature amplitude modulation (QAM) constellation set by bounding a maximum Euclidean distance of an error associated with decoding one or more least significant bits.

In some aspects, an apparatus for wireless communication includes means for receiving a wireless communication signal; and means for processing the wireless communication signal using a digital post distortion receiver based at least in part on performing an MLC set partitioning operation, wherein performing the MLC set partitioning operation comprises partitioning a QAM constellation set by bounding a maximum Euclidean distance of an error associated with decoding one or more least significant bits.

In some aspects, a method of wireless communication performed by a wireless communication device includes receiving a wireless communication signal; and processing the wireless communication signal using a digital post distortion receiver based at least in part on performing an MLC set partitioning operation, wherein performing the MLC set partitioning operation comprises partitioning a QAM constellation set by bounding a maximum Euclidean distance of an error associated with decoding one or more least significant bits.

In some aspects, a non-transitory computer-readable medium storing a set of instructions for wireless communication includes one or more instructions that, when executed by one or more processors of a wireless communication device, cause the wireless communication device to: receive a wireless communication signal; and process the wireless communication signal using a digital post distortion receiver based at least in part on performing an MLC set partitioning operation, wherein performing the MLC set partitioning operation comprises partitioning a QAM constellation set by bounding a maximum Euclidean distance of an error associated with decoding one or more least significant bits.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described herein using terminology commonly associated with a 5G or NR radio access technology (RAT), aspects of the present disclosure can be applied to other RATs, such as a 3G RAT, a 4G RAT, and/or a RAT subsequent to 5G (e.g., 6G).

Figure 1:
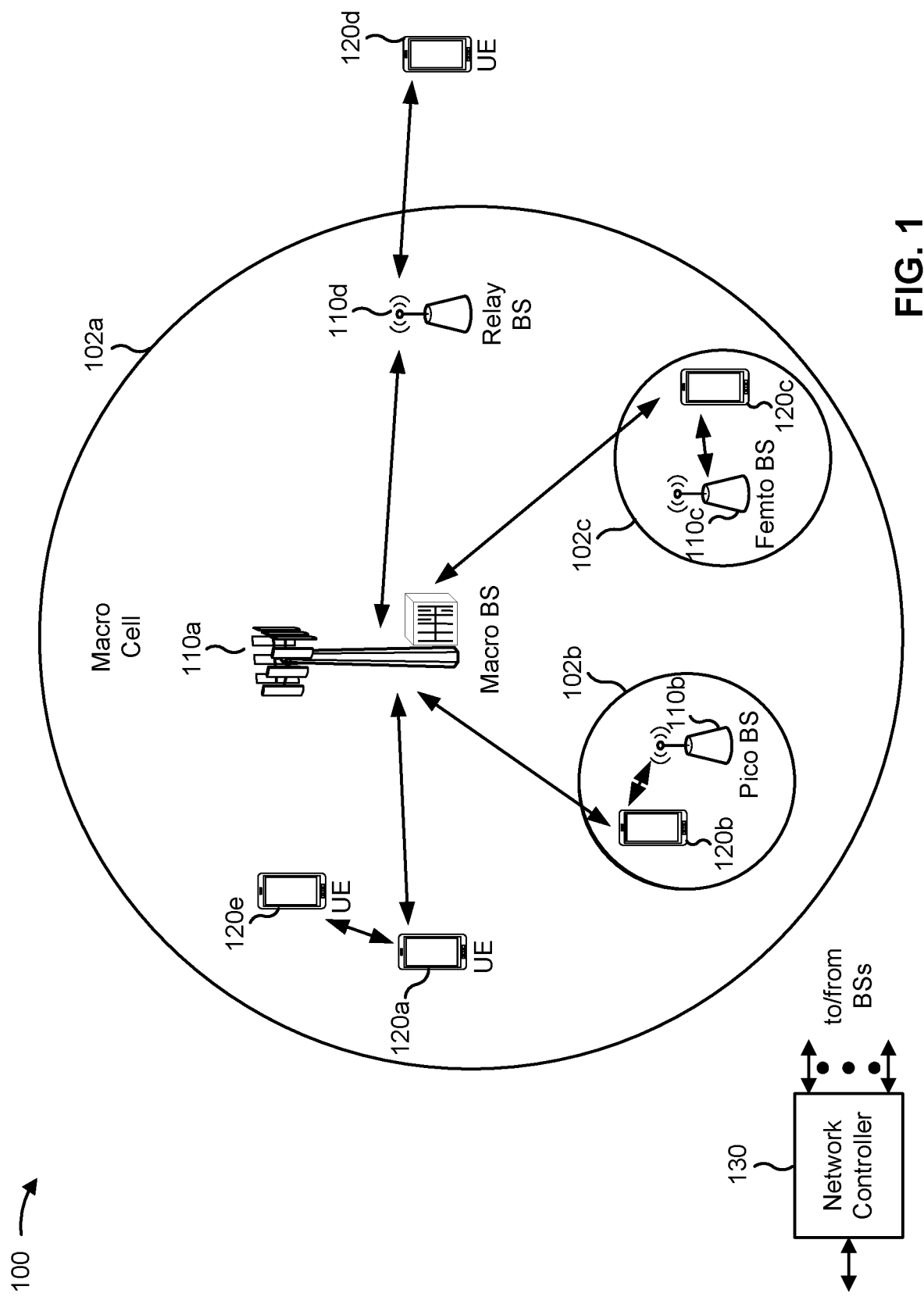
FIG. 1 is a diagram illustrating an example of a wireless network, in accordance with various aspects of the present disclosure.

FIG. 1 is a diagram illustrating an example of a wireless network 100, in accordance with various aspects of the present disclosure. The wireless network 100 may be or may include elements of a 5G (NR) network and/or an LTE network, among other examples. The wireless network 100 may include a number of base stations 110 (shown as BS 110a, BS 110b, BS 110c, and BS 110d) and other network entities. A base station (BS) is an entity that communicates with user equipment (UEs) and may also be referred to as an NR BS, a Node B, a gNB, a 5G node B (NB), an access point, a transmit receive point (TRP), or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). A BS for a macro cell may be referred to as a macro BS. A BS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces, such as a direct physical connection or a virtual network, using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay BS 110d may communicate with macro BS 110a and a UE 120d in order to facilitate communication between BS 110a and UE 120d. A relay BS may also be referred to as a relay station, a relay base station, a relay, or the like.

Wireless network 100 may be a heterogeneous network that includes BSs of different types, such as macro BSs, pico BSs, femto BSs, relay BSs, or the like. These different types of BSs may have different transmit power levels, different coverage areas, and different impacts on interference in wireless network 100. For example, macro BSs may have a high transmit power level (e.g., 5 to 40 watts) whereas pico BSs, femto BSs, and relay BSs may have lower transmit power levels (e.g., 0.1 to 2 watts).

A network controller 130 may couple to a set of BSs and may provide coordination and control for these BSs. Network controller 130 may communicate with the BSs via a backhaul. The BSs may also communicate with one another, directly or indirectly, via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, and/or location tags, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing that houses components of UE 120, such as processor components and/or memory components. In some aspects, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks may be deployed in a given geographic area. Each wireless network may support a particular RAT and may operate on one or more frequencies. A RAT may also be referred to as a radio technology, an air interface, or the like. A frequency may also be referred to as a carrier, a frequency channel, or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol or a vehicle-to-infrastructure (V2I) protocol), and/or a mesh network. In this case, the UE 120 may perform scheduling operations, resource selection operations, and/or other operations described elsewhere herein as being performed by the base station 110.

Devices of wireless network 100 may communicate using the electromagnetic spectrum, which may be subdivided based on frequency or wavelength into various classes, bands, channels, or the like. For example, devices of wireless network 100 may communicate using an operating band having a first frequency range (FR1), which may span from 410 MHz to 7.125 GHz, and/or may communicate using an operating band having a second frequency range (FR2), which may span from 24.25 GHz to 52.6 GHz. The frequencies between FR1 and FR2 are sometimes referred to as mid-band frequencies. Although a portion of FR1 is greater than 6 GHz, FR1 is often referred to as a "sub-6 GHz" band. Similarly, FR2 is often referred to as a "millimeter wave" band despite being different from the extremely high frequency (EHF) band (30 GHz-300 GHz) which is identified by the International Telecommunications Union (ITU) as a "millimeter wave" band. Thus, unless specifically stated otherwise, it should be understood that the term "sub-6 GHz" or the like, if used herein, may broadly represent frequencies less than 6 GHz, frequencies within FR1, and/or mid-band frequencies (e.g., greater than 7.125 GHz). Similarly, unless specifically stated otherwise, it should be understood that the term "millimeter wave" or the like, if used herein, may broadly represent frequencies within the EHF band, frequencies within FR2, and/or mid-band frequencies (e.g., less than 24.25 GHz). It is contemplated that the frequencies included in FR1 and FR2 may be modified, and techniques described herein are applicable to those modified frequency ranges.

As indicated above, FIG. 1 is provided as an example. Other examples may differ from what is described with regard to FIG. 1.

Figure 2:
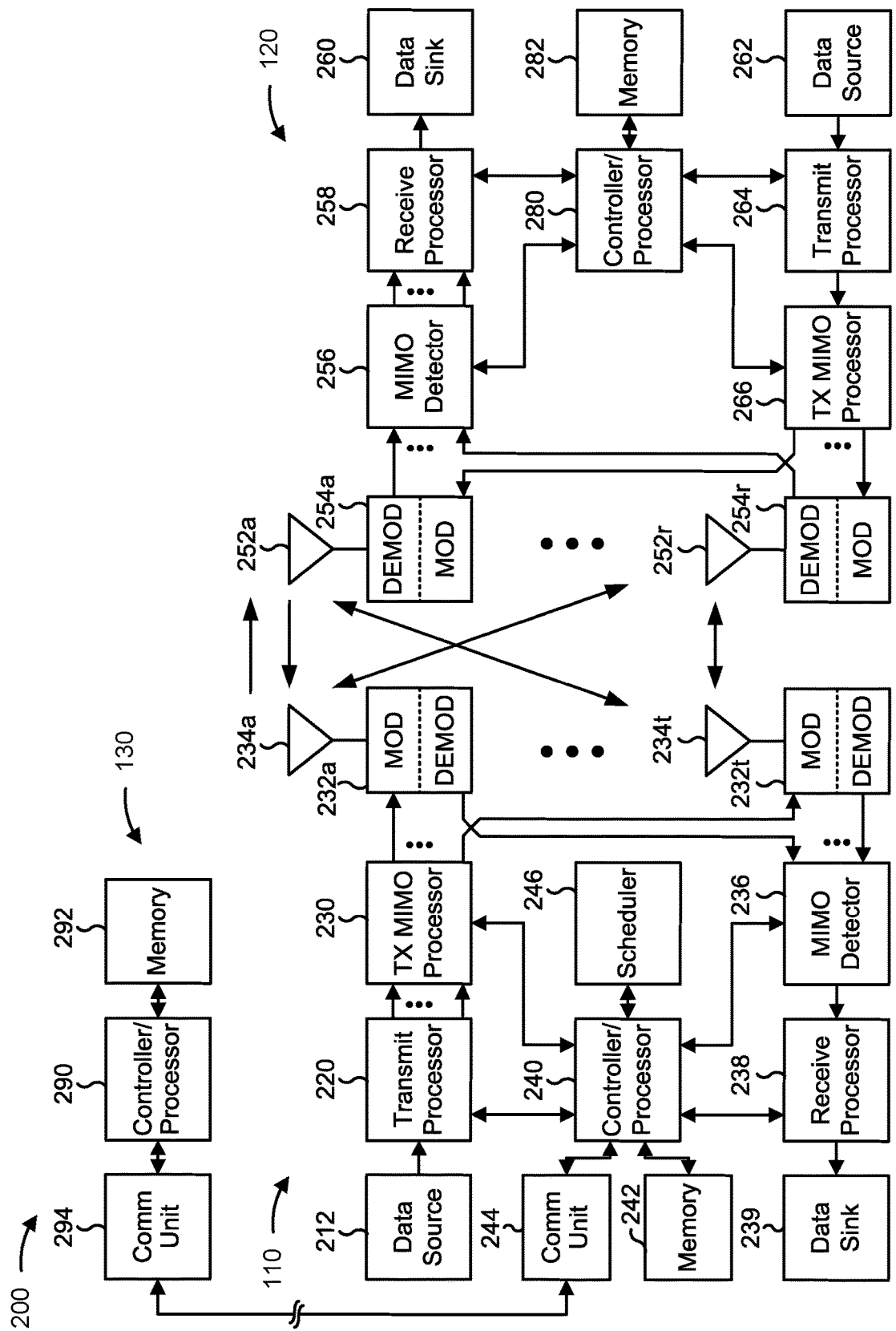
FIG. 2 is a diagram illustrating an example of a base station in communication with a UE in a wireless network, in accordance with various aspects of the present disclosure.

FIG. 2 is a diagram illustrating an example 200 of a base station 110 in communication with a UE 120 in a wireless network 100, in accordance with various aspects of the present disclosure. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI)) and control information (e.g., CQI requests, grants, and/or upper layer signaling) and provide overhead symbols and control symbols. Transmit processor 220 may also generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a channel quality indicator (CQI) parameter, among other examples. In some aspects, one or more components of UE 120 may be included in a housing 284.

Network controller 130 may include communication unit 294, controller/processor 290, and memory 292. Network controller 130 may include, for example, one or more devices in a core network. Network controller 130 may communicate with base station 110 via communication unit 294.

Antennas (e.g., antennas 234a through 234t and/or antennas 252a through 252r) may include, or may be included within, one or more antenna panels, antenna groups, sets of antenna elements, and/or antenna arrays, among other examples. An antenna panel, an antenna group, a set of antenna elements, and/or an antenna array may include one or more antenna elements. An antenna panel, an antenna group, a set of antenna elements, and/or an antenna array may include a set of coplanar antenna elements and/or a set of non-coplanar antenna elements. An antenna panel, an antenna group, a set of antenna elements, and/or an antenna array may include antenna elements within a single housing and/or antenna elements within multiple housings. An antenna panel, an antenna group, a set of antenna elements, and/or an antenna array may include one or more antenna elements coupled to one or more transmission and/or reception components, such as one or more components of FIG. 2.

On the uplink, at UE 120, a transmit processor 264 may receive and process data from a data source 262 and control information (e.g., for reports that include RSRP, RSSI, RSRQ, and/or CQI) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM or CP-OFDM), and transmitted to base station 110. In some aspects, a modulator and a demodulator (e.g., MOD/DEMOD 254) of the UE 120 may be included in a modem of the UE 120. In some aspects, the UE 120 includes a transceiver. The transceiver may include any combination of antenna(s) 252, modulators and/or demodulators 254, MIMO detector 256, receive processor 258, transmit processor 264, and/or TX MIMO processor 266. The transceiver may be used by a processor (e.g., controller/processor 280) and memory 282 to perform aspects of any of the methods described herein, for example, as described with reference to FIGS. 5-7.

At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Base station 110 may include a scheduler 246 to schedule UEs 120 for downlink and/or uplink communications. In some aspects, a modulator and a demodulator (e.g., MOD/DEMOD 232) of the base station 110 may be included in a modem of the base station 110. In some aspects, the base station 110 includes a transceiver. The transceiver may include any combination of antenna(s) 234, modulators and/or demodulators 232, MIMO detector 236, receive processor 238, transmit processor 220, and/or TX MIMO processor 230. The transceiver may be used by a processor (e.g., controller/processor 240) and memory 242 to perform aspects of any of the methods described herein, for example, as described with reference to FIGS. 5-7.

Controller/processor 240 of base station 110, controller/processor 280 of UE 120, and/or any other component(s) of FIG. 2 may perform one or more techniques associated with set partitioning for a digital post distortion (DPoD) receiver, as described in more detail elsewhere herein. In some aspects, the wireless communication device described herein is the base station 110, is included in the base station 110, or includes one or more components of the base station 110 shown in FIG. 2. In some aspects, the wireless communication device described herein is the UE 120, is included in the UE 120, or includes one or more components of the UE 120 shown in FIG. 2. For example, controller/processor 240 of base station 110, controller/processor 280 of UE 120, and/or any other component(s) of FIG. 2 may perform or direct operations of, for example, process 700 of FIG. 7, and/or other processes as described herein. Memories 242 and 282 may store data and program codes for base station 110 and UE 120, respectively. In some aspects, memory 242 and/or memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 700 of FIG. 7, and/or other processes as described herein. In some aspects, executing instructions may include running the instructions, converting the instructions, compiling the instructions, and/or interpreting the instructions, among other examples.

In some aspects, the wireless communication device includes means for receiving a wireless communication signal and/or means for processing the wireless communication signal using a digital post distortion receiver based at least in part on performing a multi-level coding (MLC) set partitioning operation, wherein performing the MLC set partitioning operation comprises partitioning a quadrature amplitude modulation (QAM) constellation set by bounding a maximum Euclidean distance of an error associated with decoding one or more least significant bits. In some aspects, the means for the wireless communication device to perform operations described herein may include, for example, one or more of transmit processor 220, TX MIMO processor 230, modulator 232, antenna 234, demodulator 232, MIMO detector 236, receive processor 238, controller/processor 240, memory 242, or scheduler 246. In some aspects, the means for the wireless communication device to perform operations described herein may include, for example, one or more of antenna 252, demodulator 254, MIMO detector 256, receive processor 258, transmit processor 264, TX MIMO processor 266, modulator 254, controller/processor 280, or memory 282.

In some aspects, the wireless communication device includes means for decoding the one or more least significant bits corresponding to the first constellation subset based at least in part on applying a channel decoder only to the least significant bits.

In some aspects, the wireless communication device includes means for filtering, from the wireless communication signal and based at least in part on the plurality of digital post distortion iterations, a non-linearity error associated with a power amplifier, to generate a filtered signal; means for determining that a signal-to-noise ratio (SNR) associated with the filtered signal satisfies an SNR condition; and/or means for estimating a transmitted symbol using a hard decision based at least in part on determining that the SNR satisfies the SNR condition.

In some aspects, the wireless communication device includes means for transmitting a capability report that indicates that the wireless communication device comprises the digital post distortion receiver.

In some aspects, the wireless communication device includes means for receiving a digital post distortion parameter indication that indicates a set partitioning type corresponding to the MLC set partitioning operation.

In some aspects, the wireless communication device includes means for receiving a capability report that indicates that the wireless communication device comprises the digital post distortion receiver.

In some aspects, the wireless communication device includes means for transmitting a digital post distortion parameter indication that indicates a set partitioning type corresponding to the MLC set partitioning operation.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of controller/processor 280.

As indicated above, FIG. 2 is provided as an example. Other examples may differ from what is described with regard to FIG. 2.

Figure 3:
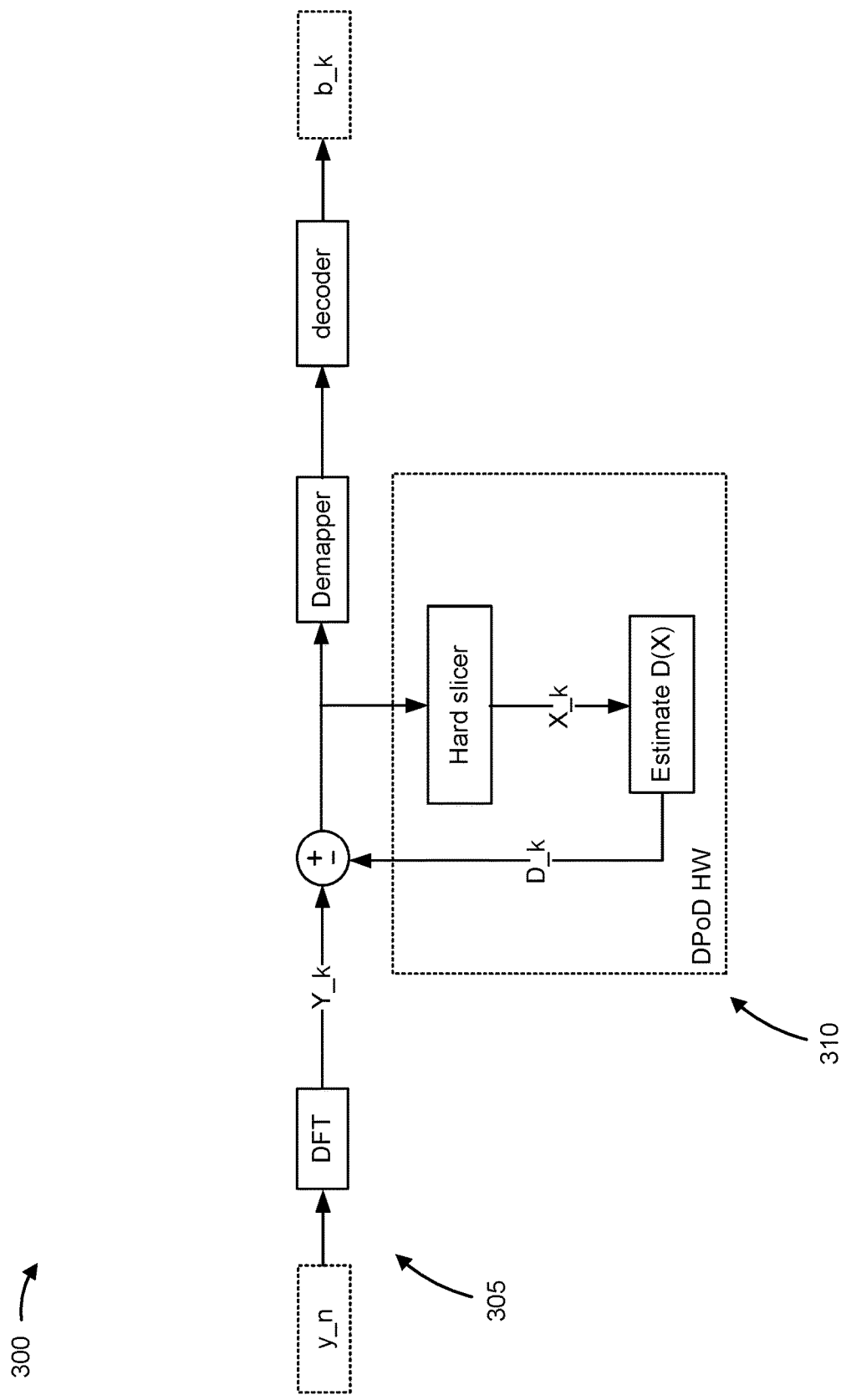
FIG. 3 is a diagram illustrating an example of a digital post distortion (DPoD) receiver, in accordance with various aspects of the present disclosure.

FIG. 3 is a diagram illustrating an example 300 of a digital post distortion (DPoD) receiver, in accordance with various aspects of the present disclosure. As shown in FIG. 3, a DPoD receiver may include a receiver chain 305 and a DPoD component 310 coupled thereto.

As shown, the receiver chain 305 may include an inverse Fast Fourier Transform (iFFT) component configured to receive a received signal (shown as "y_n") and to transform time-domain components of the received signal to a frequency domain signal (shown as "Y_k"). The frequency-domain signal is provided to a demapper to extract symbols, and the symbols are provided to a decoder that extracts bits (shown as "b k") based on the symbols.

In some communications systems, a transmitter may, as power increases, transmit signals with increasing non-linearity. For example, a high-power amplifier (HPA) with a limited dynamic range (DR) may distort a transmitted signal as a result of a relatively higher peak to average power ratio. The non-linear distortion may be an in-band distortion, which affects link performance in connection with an error vector magnitude (EVM) amount, or out-band distortion, which causes adjacent channel interference (e. g., the transmitted signal interferes with other signals on neighboring frequency bands). To avoid non-linearity and accompanying interference, the transmitter device may apply a power back-off value to reduce transmit power, thereby reducing non-linearity.

However, applying a power back-off value may result in reduced power efficiency (e. g., less available transmit power is used to transmit in a channel, thereby reducing range, signal to interference noise ratio, and/or the like). The transmitter may apply digital pre-distortion (DPD) processing to reduce non-linear distortion to less than a threshold level with a reduced level of power back-off, thereby increasing power efficiency relative to avoiding non-linear distortion using only a power back-off. However, although DPD processing may correct an in-dynamic-range non-linearity affect, non-linearity may still cause a clipping effect (e.g., resulting from the limited dynamic range). This may limit an effectiveness of DPD processing and an associated power efficiency benefit of DPD processing. Moreover, use of DPD processing may be limited to relatively high transmit power values present at a cell edge and may not be used away from the cell edge.

To account for limitations of DPD processing, the receiver may apply DPoD processing. DPoD processing may be performed by the DPoD component 310, which may include hardware and/or software configured to implement an algorithm configured to remove non-linear noise that is generated by a known model (e.g., power amplifier clipping). In DPoD processing, for example, the receiver may account for non-linearity-induced clipping. As a result, DPoD processing may be effective both away from and at a cell edge.

As shown, the DPoD receiver works using iterations, where each iteration includes a hard decision slicing to determine estimated constellation points (shown as "X_k"). The DPoD component 310 includes a nonlinear model of the power amplifier that is used to estimate nonlinear noise (shown as "D_k"). The estimated nonlinear noise is subtracted from the frequency domain signal. Initial DPoD iterations suffer from strong noise due to the non-linearity that is not accounted for by the hard decision slicing. In some cases, a set partitioning algorithm may be used to partition constellation points.

As indicated above, FIG. 3 is provided as an example. Other examples may differ from what is described with respect to FIG. 3.

Figure 4:
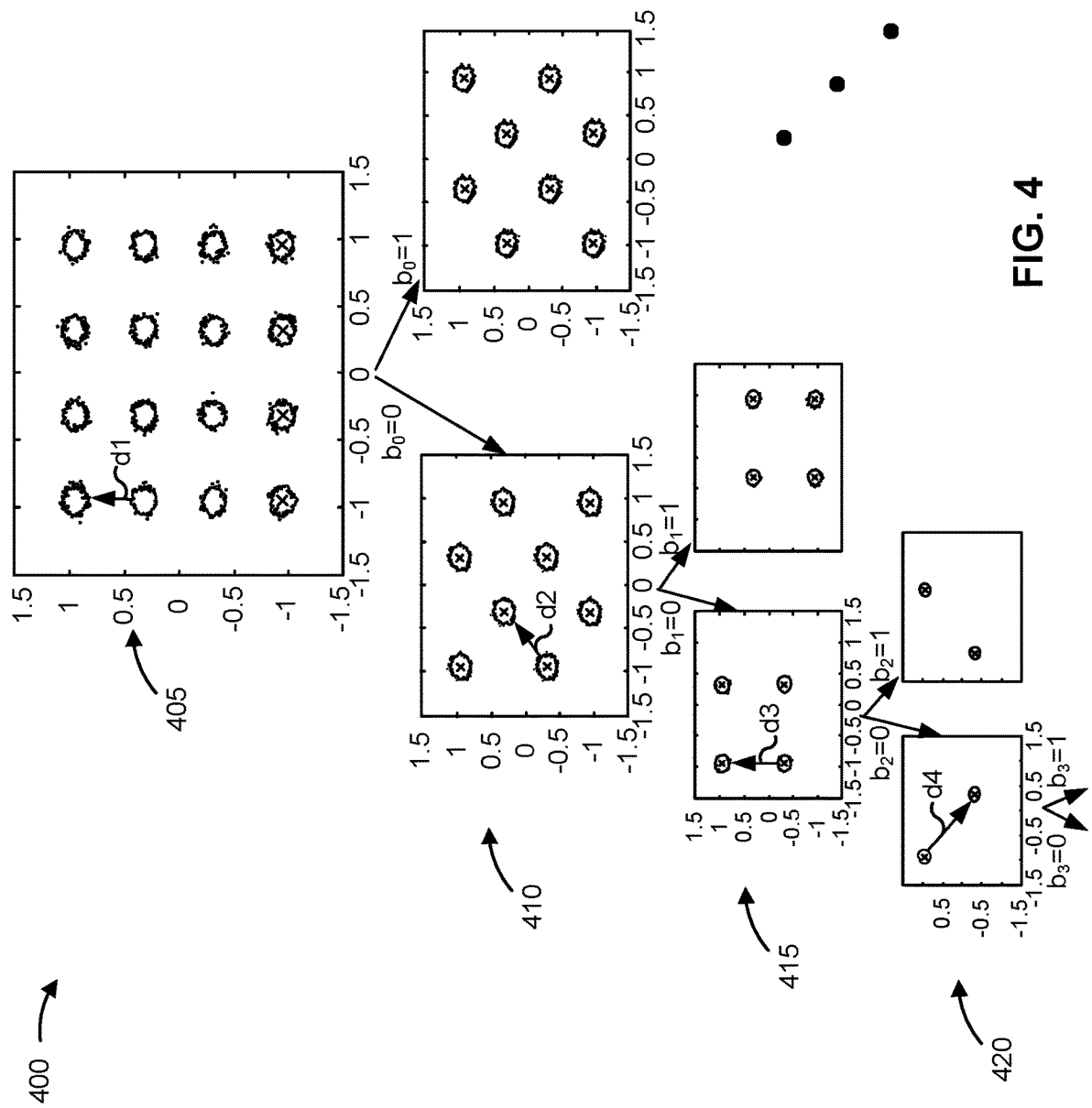
FIG. 4 is a diagram illustrating an example of multi-level coding (MLC) set partitioning, in accordance with various aspects of the present disclosure.

FIG. 4 is a diagram illustrating an example 400 of multi-level coding (MLC) set partitioning, in accordance with various aspects of the present disclosure. As shown in FIG. 4, set partitioning may be used to generate constellation subsets based on constellation sets.

As shown by reference number 405, a constellation diagram may include constellation points graphed in a Euclidean space. In the illustrated example 400, the constellation diagram depicts a constellation set associated with a 16 point quadrature amplitude modulation (QAM) telecommunication scheme with additive white Gaussian noise (AWGN).

As shown by reference number 410, the constellation set is partitioned into subsets, where subsets of each hierarchy have a minimum Euclidean distance, d2, between the points of the subset that is greater than the minimum Euclidean distance, d1, between the points of the highest hierarchy (the constellation set). The Euclidean distance is the linear distance on the constellation diagram between adjacent constellation points. This Euclidean distance is a measure of the capability of a hard decision decoder to discriminate between points in the subset in the presence of noise. For example, the Euclidean distance may be the distance of an error associated with decoding one or more least significant bits. As shown by reference number 415, the subsets are partitioned into further subsets having a minimum Euclidean distance, d3, that is larger than the minimum Euclidean distance d2 of the next highest hierarchy. As shown by reference number 420, the further subsets are similarly partitioned into subsets having a minimum Euclidean distance, d4, that is larger than the minimum Euclidean distance d3 of the next highest hierarchy. For example, d4>d3>d2>d1.

The coding of the information carried by each hierarchy is protected by a different code rate in order to maximize the overall spectral efficiency. As the AWGN is omnidirectional, optimal partitioning to hierarchal constellation subsets is independent from the noise variance. However, the MLC set partitioning described above is not effective for use in partitioning constellation sets in initial iterations of a DPoD procedure. Because the constellation set is partitioned into constellation subsets with increasing smallest Euclidean distance between constellation points, the nonlinearity may be too strong and the DPoD procedure may get stuck in the initial iterations.

According to aspects of techniques and apparatuses described herein, a set portioning operation that includes bounding smallest Euclidean distances between constellation points is used to facilitate constellation partitioning for iterations of a DPoD receiver. In some aspects, a wireless communication device may receive a wireless communication signal and process the wireless communication signal using a DPoD receiver. The wireless communication device may process the signal based at least in part on performing an MLC set partitioning operation that includes partitioning a QAM constellation set by bounding a maximum Euclidean distance of an error associated with decoding one or more least significant bits.

The set partitioning operation may be used to determine one or more slices as part of the hard slicing decisions in the DPoD operation. The set partitioning operation may be implemented for one or more initial iterations of the DPoD operation. Since the slicing errors are close to the constellation points in terms of Euclidian distance, the iterative nature of the DPoD may produce a successful result. In this way, aspects may improve DPoD operation by improving the ability of the DPoD to handle strong non-linearities, thereby facilitating improvements in wireless communication device performance.

As indicated above, FIG. 4 is provided as an example. Other examples may differ from what is described with respect to FIG. 4.

Figure 5:
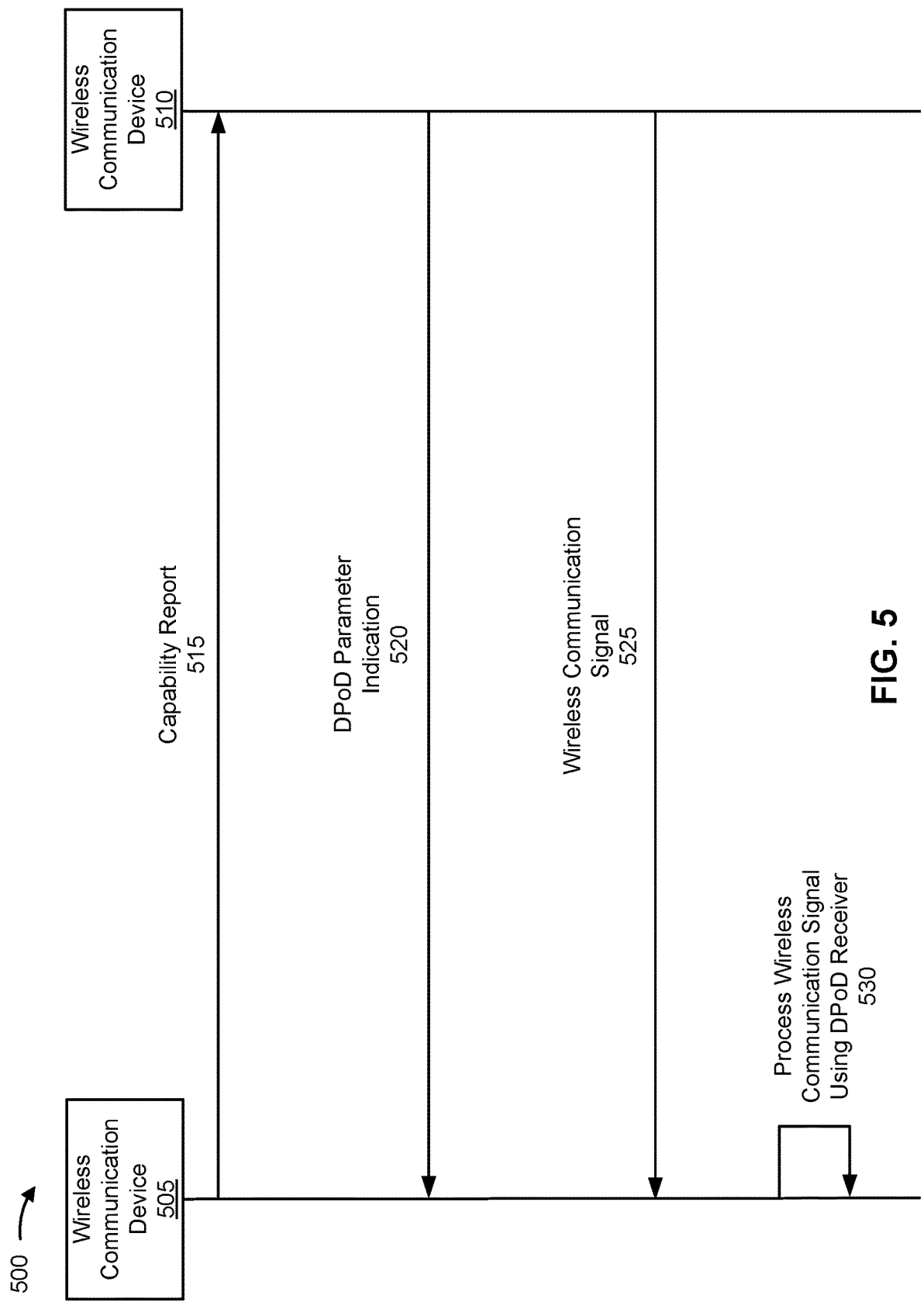
FIGS. 5 and 6 are diagrams illustrating examples associated with set partitioning for a DPoD receiver, in accordance with various aspects of the present disclosure.

FIG. 5 is a diagram illustrating an example 500 associated with set partitioning for a DPoD receiver, in accordance with various aspects of the present disclosure. As shown in FIG. 5, a first wireless communication device 505 and a second wireless communication device 510 may communicate with one another. The first wireless communication device 505 and/or the second wireless communication device 510 may be a base station (e.g., base station 110 shown in FIG. 1), a UE (e.g., UE 120 shown in FIG. 1), an integrated access and backhaul (IAB) node, and/or any other wireless communication device.

As shown by reference number 515, the first wireless communication device 505 may transmit, and the second wireless communication device 510 may receive, a capability report. The capability report may include a signal, a packet, and/or a bit or bits that indicate that the first wireless communication device 505 includes a DPoD receiver capable of performing the DPoD operation described herein. In this way, the second wireless communication device 510 may configure a wireless communication transmission based at least in part on the capability.

As shown by reference number 520, the second wireless communication device 510 may transmit, and the first wireless communication device 505 may receive, a DPoD parameter indication. The DPoD parameter indication may indicate a set partitioning type corresponding to an MLC set partitioning operation. The DPoD parameter indication may indicate a selected code rate. In some aspects, for example, the DPoD parameter indication may be carried in downlink control information (DCI).

As shown by reference number 525, the second wireless communication device 510 may transmit, and the first wireless communication device 505 may receive, a wireless communication signal. As shown by reference number 530, the first wireless communication device 505 may process the wireless communication signal. In some aspects, for example, the first wireless communication device 505 may process the wireless communication signal using a DPoD receiver. The first wireless communication device 505 may process the wireless communication signal based at least in part on performing an MLC set partitioning operation. In some aspects, the first wireless communication device 505 may perform the MLC set partitioning operation based at least in part on partitioning a QAM constellation set by bounding a maximum Euclidean distance of an error associated with decoding one or more least significant bits.

In some aspects, the first wireless communication device 505 may perform the MLC set partitioning operation based at least in part on partitioning the QAM constellation set into a first QAM constellation subset and a second QAM constellation subset. The first QAM constellation subset may include a first half of the QAM constellation set and the second QAM constellation subset may include a second half of the QAM constellation set. In some aspects, each partition may include a separate channel code protecting its contents. For example, a first channel code may correspond to the first QAM constellation subset and a second channel code may correspond to the second QAM constellation subset.

In some aspects, since a DPoD receiver is insensitive to small Euclidian distance errors in hard decisions in one or more initial iterations, the channel decoder may be applied only to least significant bits during the DPoD operation to get a more bounded slicing decision. For example, the first wireless communication device 505 may decode the one or more least significant bits corresponding to the first constellation subset based at least in part on applying a channel decoder only to the least significant bits.

After one or more initial DPoD iterations, the signal-to-noise ratio (SNR) may improve such that the first wireless communication device 505 may use simple hard decisions for further iterations. In some aspects, processing the wireless communication signal may include performing a plurality of digital post distortion iterations. In some aspects, for example, the first wireless communication device 505 may filter, from the wireless communication signal and based at least in part on the plurality of digital post distortion iterations, a non-linearity error associated with a power amplifier, to generate a filtered signal. The first wireless communication device 505 may determine that the SNR associated with the filtered signal satisfies an SNR condition and may estimate a transmitted symbol using a hard decision based at least in part on determining that the SNR satisfies the SNR condition. The SNR condition may include a threshold, a specified range, and/or another value or value condition.

According to aspects of techniques and apparatuses described above, a set portioning operation that includes bounding smallest Euclidean distances between constellation points may be used to facilitate constellation partitioning for iterations of a DPoD receiver. The wireless communication device may process a signal based at least in part on performing an MLC set partitioning operation that includes partitioning a QAM constellation set by bounding a maximum Euclidean distance of an error associated with decoding one or more least significant bits. Since the slicing errors are close to the constellation points in terms of Euclidian distance, the iterative nature of the DPoD may produce a successful result. In this way, aspects may improve DPoD operation by improving the ability of the DPoD to handle strong non-linearities, thereby facilitating improvements in wireless communication device performance.

As indicated above, FIG. 5 is provided as an example. Other examples may differ from what is described with respect to FIG. 5.

Figure 6:
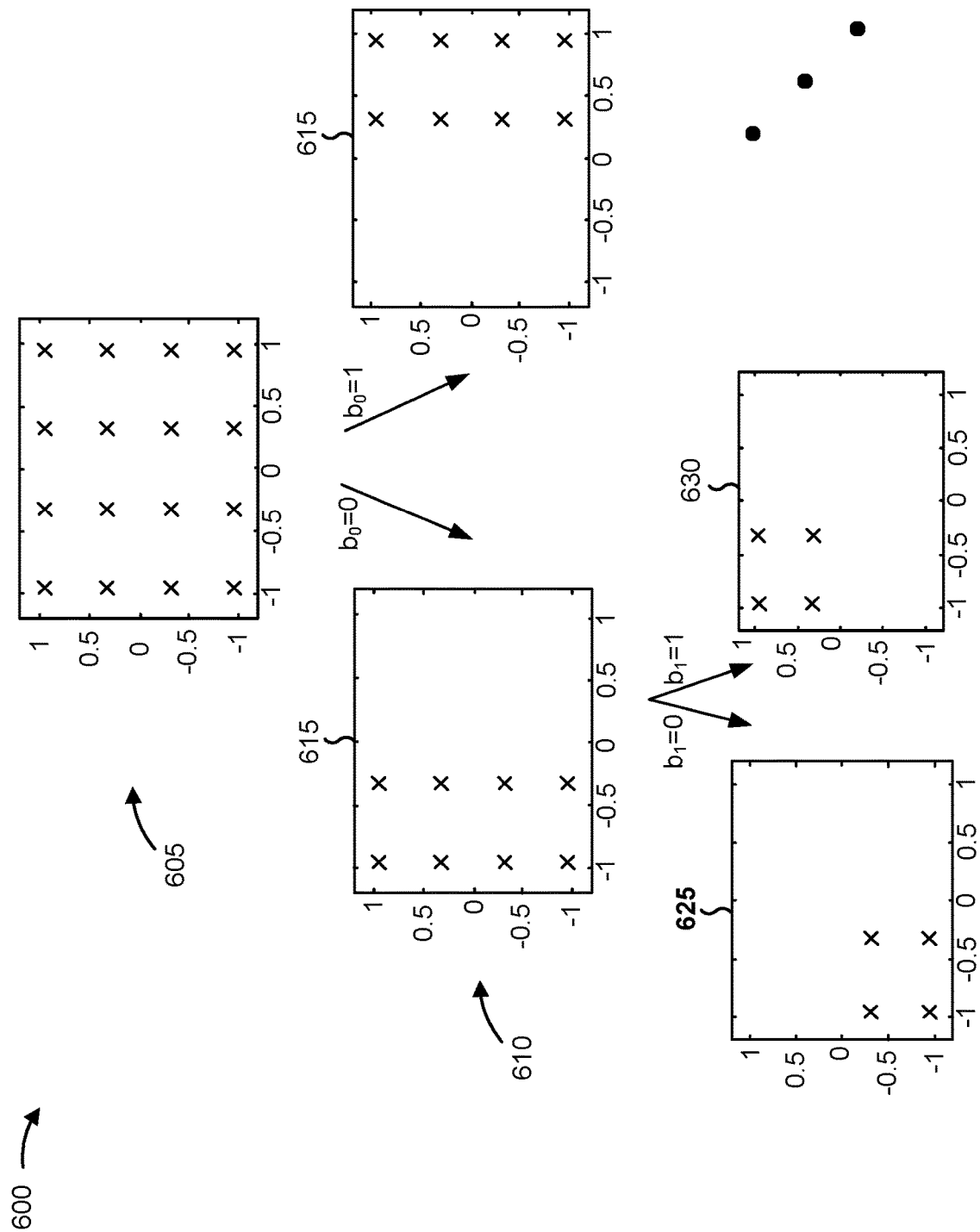

FIG. 6 is a diagram illustrating an example 600 associated with set partitioning for a DPoD receiver, in accordance with various aspects of the present disclosure. The DPoD receiver may include a DPoD receiver such as the DPoD receiver described in connection with the first wireless communication device 505 depicted in FIG. 5.

As shown by reference number 605, a constellation diagram may include constellation points graphed in a Euclidean space. In the illustrated example 605, the constellation diagram depicts a constellation set associated with a 16 point QAM telecommunication scheme. As shown by reference number 610, the constellation set is progressively partitioned into subsets to group close-by constellation points (which may be referred to as "constellation symbols").

In some aspects, as described above in connection with FIG. 5, a set partitioning operation shown in FIG. 6 may be performed based at least in part on partitioning the QAM constellation set by bounding a maximum Euclidean distance of an error associated with decoding one or more least significant bits. For example, a wireless communication device, using the DPoD receiver, may perform an MLC set partitioning operation based at least in part on partitioning the QAM constellation set into a first QAM constellation subset 615 and a second QAM constellation subset 620. The first QAM constellation subset 615 may include a first half of the QAM constellation points in the QAM constellation set, and the second QAM constellation subset may include a second half of the QAM constellation points in the QAM constellation set.

For example, as shown in FIG. 6, the first QAM constellation subset 615 may include a left half of the QAM constellation set and the second QAM constellation subset 620 may include a right half of the QAM constellation set. In some aspects, the first QAM constellation subset 615 may include a top half of the QAM constellation set and the second QAM constellation subset 620 may include a bottom half of the QAM constellation set. As is further shown in FIG. 6, the first QAM constellation subset 615 may be similarly partitioned into a third QAM constellation subset 625 and a fourth QAM constellation subset 630. As shown, for example, the third QAM constellation subset 625 may include a bottom half of the first QAM constellation subset 615. This bottom half may also correspond to a first quadrant of the QAM constellation set. The fourth QAM constellation subset 630 may include a top half of the first QAM constellation subset 615. This top half may also correspond to a second quadrant of the QAM constellation set. Although not illustrated, the second QAM constellation subset 620 may be similarly partitioned. In some aspects, the third and fourth QAM constellation subsets may be similarly partitioned, and so on.

As indicated above, FIG. 6 is provided as an example. Other examples may differ from what is described with respect to FIG. 6.

Figure 7:
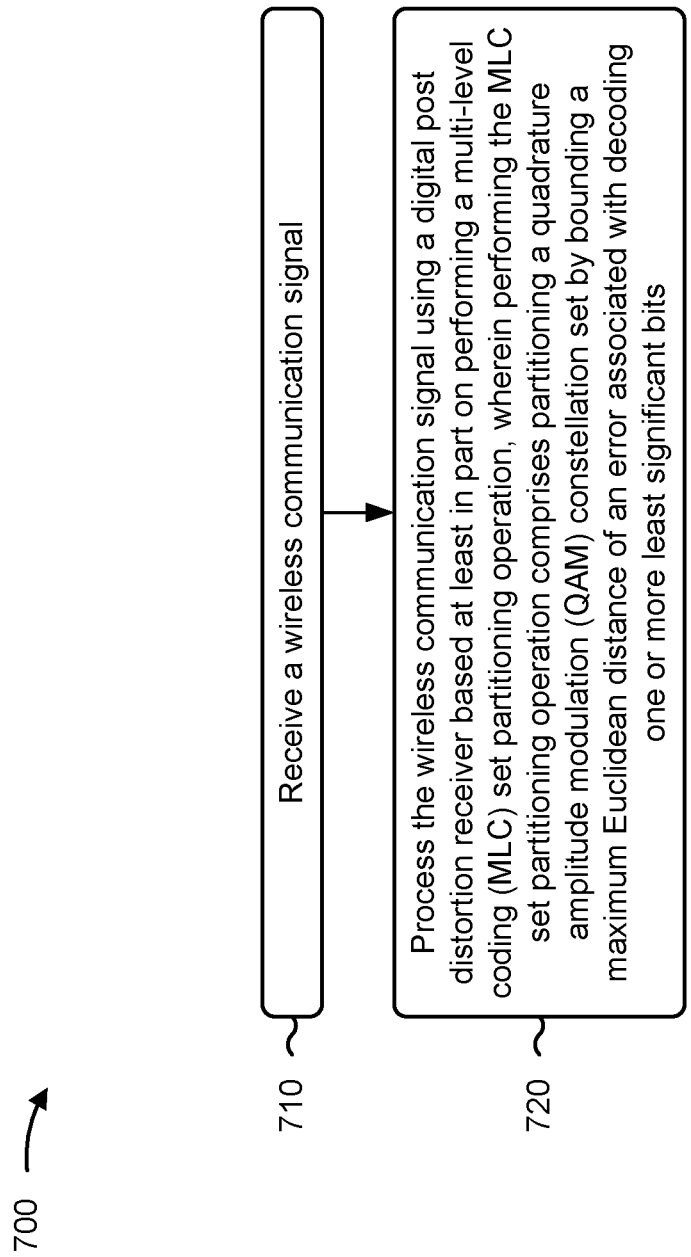
FIG. 7 is a diagram illustrating an example process associated with set partitioning for a DPoD receiver, in accordance with various aspects of the present disclosure.

FIG. 7 is a diagram illustrating an example process 700 performed, for example, by a wireless communication device, in accordance with various aspects of the present disclosure. Example process 700 is an example where the wireless communication device (e.g., wireless communication device 505 and/or wireless communication device 510) performs operations associated with set partitioning for a DPoD receiver.

As shown in FIG. 7, in some aspects, process 700 may include receiving a wireless communication signal (block 710). For example, the wireless communication device (e.g., using reception component 802, depicted in FIG. 8) may receive a wireless communication signal, as described above.

As further shown in FIG. 7, in some aspects, process 700 may include processing the wireless communication signal using a digital post distortion receiver based at least in part on performing an MLC set partitioning operation, wherein performing the MLC set partitioning operation comprises partitioning a QAM constellation set by bounding a maximum Euclidean distance of an error associated with decoding one or more least significant bits (block 720). For example, the wireless communication device (e.g., using processing component 808, depicted in FIG. 8) may process the wireless communication signal using a digital post distortion receiver based at least in part on performing an MLC set partitioning operation, wherein performing the MLC set partitioning operation comprises partitioning a QAM constellation set by bounding a maximum Euclidean distance of an error associated with decoding one or more least significant bits, as described above.

Process 700 may include additional aspects, such as any single aspect or any combination of aspects described below and/or in connection with one or more other processes described elsewhere herein.

In a first aspect, performing the set partitioning operation comprises partitioning the QAM constellation set into a first QAM constellation subset and a second QAM constellation subset, wherein the first QAM constellation subset comprises a first half of the QAM constellation set and the second QAM constellation subset comprises a second half of the QAM constellation set.

In a second aspect, alone or in combination with the first aspect, a first channel code corresponds to the first QAM constellation subset and a second channel code corresponds to the second QAM constellation subset.

In a third aspect, alone or in combination with one or more of the first and second aspects, process 700 includes decoding the one or more least significant bits corresponding to the first constellation subset based at least in part on applying a channel decoder only to the least significant bits.

In a fourth aspect, alone or in combination with one or more of the first through third aspects, processing the wireless communication signal comprises performing a plurality of digital post distortion iterations.

In a fifth aspect, alone or in combination with the fourth aspect, process 700 includes filtering, from the wireless communication signal and based at least in part on the plurality of digital post distortion iterations, a non-linearity error associated with a power amplifier, to generate a filtered signal, determining that an SNR associated with the filtered signal satisfies an SNR condition, and estimating a transmitted symbol using a hard decision based at least in part on determining that the SNR satisfies the SNR condition.

In a sixth aspect, alone or in combination with one or more of the first through fifth aspects, process 700 includes transmitting a capability report that indicates that the wireless communication device comprises the digital post distortion receiver.

In a seventh aspect, alone or in combination with one or more of the first through sixth aspects, process 700 includes receiving a digital post distortion parameter indication that indicates a set partitioning type corresponding to the MLC set partitioning operation.

In an eighth aspect, alone or in combination with the seventh aspect, the digital post distortion parameter indication indicates a selected code rate.

In a ninth aspect, alone or in combination with one or more of the seventh through eighth aspects, the digital post distortion parameter indication is carried in downlink control information.

In a tenth aspect, alone or in combination with one or more of the first through ninth aspects, the wireless communication device comprises a user equipment.

In an eleventh aspect, alone or in combination with one or more of the first through fifth aspects, process 700 includes receiving a capability report that indicates that the wireless communication device comprises the digital post distortion receiver.

In a twelfth aspect, alone or in combination with one or more of the first through fifth or eleventh aspects, process 700 includes transmitting a digital post distortion parameter indication that indicates a set partitioning type corresponding to the MLC set partitioning operation.

In a thirteenth aspect, alone or in combination with the twelfth aspect, the digital post distortion parameter indication indicates a selected code rate.

In a fourteenth aspect, alone or in combination with one or more of the first through fifth or eleventh through thirteenth aspects, the wireless communication device comprises a base station.

Although FIG. 7 shows example blocks of process 700, in some aspects, process 700 may include additional blocks, fewer blocks, different blocks, or differently arranged blocks than those depicted in FIG. 7. Additionally, or alternatively, two or more of the blocks of process 700 may be performed in parallel.

Figure 8:
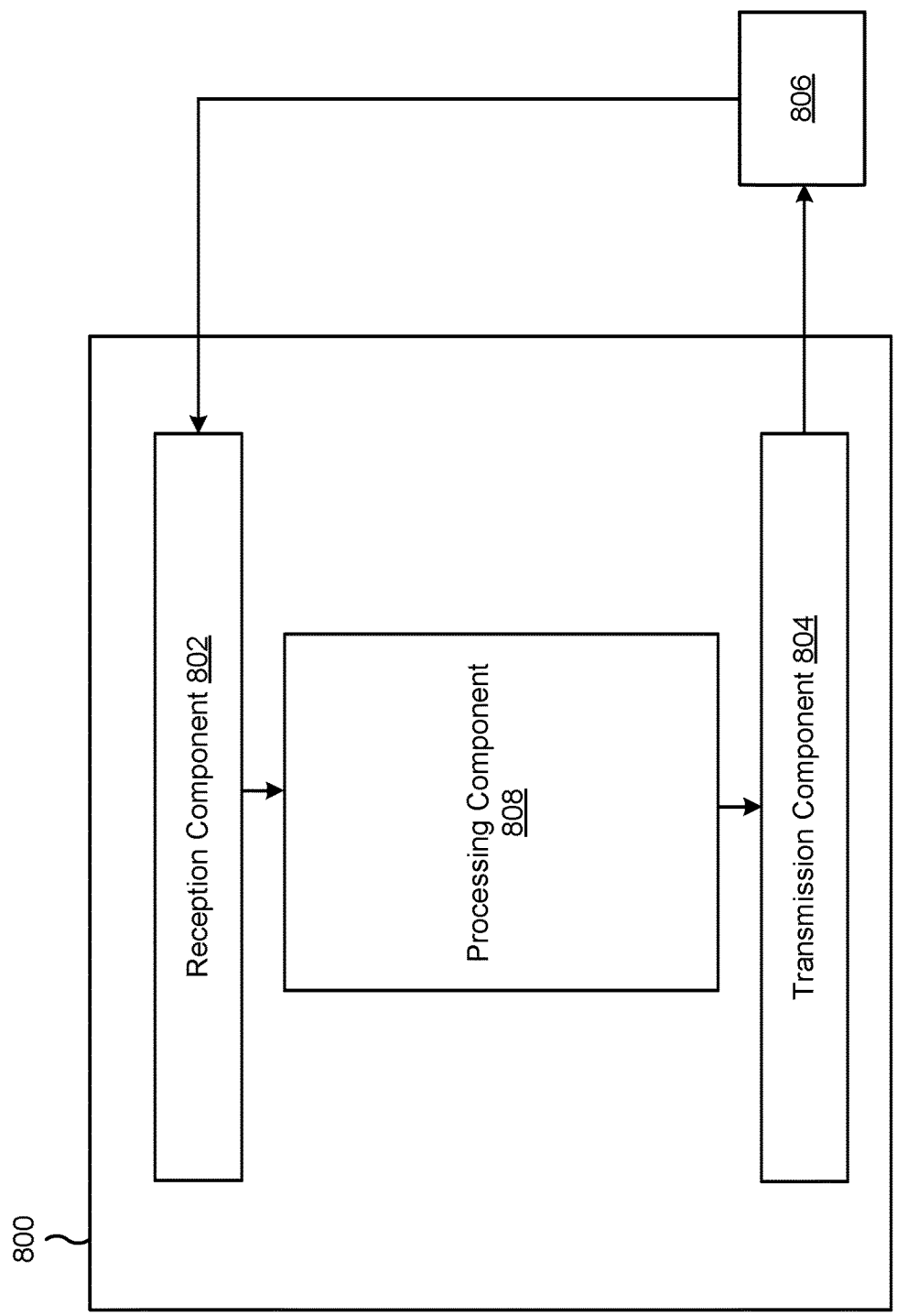
FIG. 8 is a block diagram of an example apparatus for wireless communication, in accordance with various aspects of the present disclosure.

FIG. 8 is a block diagram of an example apparatus 800 for wireless communication. The apparatus 800 may be a wireless communication device (e.g., a UE, a base station, and/or an IAB node, among other examples) or a wireless communication device may include the apparatus 800. The wireless communication device may be, include, or be included in, the wireless communication device 505 shown in FIG. 5 and/or the wireless communication device 510 shown in FIG. 5. In some aspects, the apparatus 800 includes a reception component 802 and a transmission component 804, which may be in communication with one another (for example, via one or more buses and/or one or more other components). As shown, the apparatus 800 may communicate with another apparatus 806 (such as a UE, a base station, or another wireless communication device) using the reception component 802 and the transmission component 804. As further shown, the apparatus 800 may include a processing component 808.

In some aspects, the apparatus 800 may be configured to perform one or more operations described herein in connection with FIGS. 5 and 6. Additionally, or alternatively, the apparatus 800 may be configured to perform one or more processes described herein, such as process 700 of FIG. 7. In some aspects, the apparatus 800 and/or one or more components shown in FIG. 8 may include one or more components of the UE and/or the base station described above in connection with FIG. 2. Additionally, or alternatively, one or more components shown in FIG. 8 may be implemented within one or more components described above in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 802 may receive communications, such as reference signals, control information, data communications, or a combination thereof, from the apparatus 806. The reception component 802 may provide received communications to one or more other components of the apparatus 800. In some aspects, the reception component 802 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 806. In some aspects, the reception component 802 may include one or more antennas, a demodulator, a MIMO detector, a receive processor, a controller/processor, a memory, or a combination thereof, of the UE and/or the base station described above in connection with FIG. 2.

The transmission component 804 may transmit communications, such as reference signals, control information, data communications, or a combination thereof, to the apparatus 806. In some aspects, one or more other components of the apparatus 806 may generate communications and may provide the generated communications to the transmission component 804 for transmission to the apparatus 806. In some aspects, the transmission component 804 may perform signal processing on the generated communications (such as filtering, amplification, modulation, digital-to-analog conversion, multiplexing, interleaving, mapping, or encoding, among other examples), and may transmit the processed signals to the apparatus 806. In some aspects, the transmission component 804 may include one or more antennas, a modulator, a transmit MIMO processor, a transmit processor, a controller/processor, a memory, or a combination thereof, of the UE and/or the base station described above in connection with FIG. 2. In some aspects, the transmission component 804 may be co-located with the reception component 802 in a transceiver.

The reception component 802 may receive a wireless communication signal. The processing component 808 may process the wireless communication signal using a digital post distortion receiver based at least in part on performing an MLC set partitioning operation, wherein performing the MLC set partitioning operation comprises partitioning a QAM constellation set by bounding a maximum Euclidean distance of an error associated with decoding one or more least significant bits. In some aspects, the processing component 808 may include a modulator, a transmit MIMO processor, a receive MIMO processor, a transmit processor, a receive processor, a controller/processor, a memory, or a combination thereof, of the UE and/or the base station described above in connection with FIG. 2. In some aspects, the processing component 808 may include the transmission component 804 and/or the reception component 802.

The processing component 808 may decode the one or more least significant bits corresponding to the first constellation subset based at least in part on applying a channel decoder only to the least significant bits. The processing component 808 may filter, from the wireless communication signal and based at least in part on the plurality of digital post distortion iterations, a non-linearity error associated with a power amplifier, to generate a filtered signal. The processing component 808 may determine that an SNR associated with the filtered signal satisfies an SNR condition. The processing component 808 may estimate a transmitted symbol using a hard decision based at least in part on determining that the SNR satisfies the SNR condition.

The transmission component 804 may transmit a capability report that indicates that the wireless communication device comprises the digital post distortion receiver. The reception component 802 may receive a digital post distortion parameter indication that indicates a set partitioning type corresponding to the MLC set partitioning operation. The reception component 802 may receive a capability report that indicates that the wireless communication device comprises the digital post distortion receiver. The transmission component 804 may transmit a digital post distortion parameter indication that indicates a set partitioning type corresponding to the MLC set partitioning operation.

The number and arrangement of components shown in FIG. 8 are provided as an example. In practice, there may be additional components, fewer components, different components, or differently arranged components than those shown in FIG. 8. Furthermore, two or more components shown in FIG. 8 may be implemented within a single component, or a single component shown in FIG. 8 may be implemented as multiple, distributed components. Additionally, or alternatively, a set of (one or more) components shown in FIG. 8 may perform one or more functions described as being performed by another set of components shown in FIG. 8.

The following provides an overview of aspects of the present disclosure:

Aspect 1: A method of wireless communication performed by a wireless communication device, comprising: receiving a wireless communication signal; and processing the wireless communication signal using a digital post distortion receiver based at least in part on performing a multi-level coding (MLC) set partitioning operation, wherein performing the MLC set partitioning operation comprises partitioning a quadrature amplitude modulation (QAM) constellation set by bounding a maximum Euclidean distance of an error associated with decoding one or more least significant bits.

Aspect 2: The method of aspect 1, wherein performing the set partitioning operation comprises partitioning the QAM constellation set into a first QAM constellation subset and a second QAM constellation subset, wherein the first QAM constellation subset comprises a first half of the QAM constellation set and the second QAM constellation subset comprises a second half of the QAM constellation set.

Aspect 3: The method of aspect 2, wherein a first channel code corresponds to the first QAM constellation subset and a second channel code corresponds to the second QAM constellation subset.

Aspect 4: The method of any of aspects 1-3, further comprising decoding the one or more least significant bits corresponding to the first constellation subset based at least in part on applying a channel decoder only to the least significant bits.

Aspect 5: The method of any of aspects 1-4, wherein processing the wireless communication signal comprises performing a plurality of digital post distortion iterations.

Aspect 6: The method of aspect 5, further comprising: filtering, from the wireless communication signal and based at least in part on the plurality of digital post distortion iterations, a non-linearity error associated with a power amplifier, to generate a filtered signal; determining that a signal-to-noise ratio (SNR) associated with the filtered signal satisfies an SNR condition; and estimating a transmitted symbol using a hard decision based at least in part on determining that the SNR satisfies the SNR condition.

Aspect 7: The method of any of aspects 1-6, further comprising transmitting a capability report that indicates that the wireless communication device comprises the digital post distortion receiver.

Aspect 8: The method of any of aspects 1-7, further comprising receiving a digital post distortion parameter indication that indicates a set partitioning type corresponding to the MLC set partitioning operation.

Aspect 9: The method of aspect 8, wherein the digital post distortion parameter indication indicates a selected code rate.

Aspect 10: The method of either of aspects 8 or 9, wherein the digital post distortion parameter indication is carried in downlink control information.

Aspect 11: The method of any of aspects 1-10, wherein the wireless communication device comprises a user equipment.

Aspect 13: The method of any of aspects 1-6 or 12, further comprising transmitting a digital post distortion parameter indication that indicates a set partitioning type corresponding to the MLC set partitioning operation.

Aspect 14: The method of aspect 13, wherein the digital post distortion parameter indication indicates a selected code rate.

Aspect 15: The method of any of aspects 1-6 or 12-14, wherein the wireless communication device comprises a base station.

Aspect 15: An apparatus for wireless communication at a device, comprising a processor; memory coupled with the processor; and instructions stored in the memory and executable by the processor to cause the apparatus to perform the method of one or more aspects of aspects 1-15.

Aspect 16: A device for wireless communication, comprising a memory and one or more processors coupled to the memory, the memory and the one or more processors configured to perform the method of one or more aspects of aspects 1-15.

Aspect 17: An apparatus for wireless communication, comprising at least one means for performing the method of one or more aspects of aspects 1-15.

Aspect 18: A non-transitory computer-readable medium storing code for wireless communication, the code comprising instructions executable by a processor to perform the method of one or more aspects of aspects 1-15.

Aspect 19: A non-transitory computer-readable medium storing a set of instructions for wireless communication, the set of instructions comprising one or more instructions that, when executed by one or more processors of a device, cause the device to perform the method of one or more aspects of aspects 1-15.

The foregoing disclosure provides illustration and description, but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a processor is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A wireless communication device for wireless communication, comprising:
   a memory; and
   one or more processors coupled to the memory, the memory and the one or more processors configured to:
      receive a wireless communication signal; and
      process the wireless communication signal using a digital post distortion receiver based at least in part on performing a multi-level coding (MLC) set partitioning operation, wherein performing the MLC set partitioning operation comprises partitioning a quadrature amplitude modulation (QAM) constellation set by bounding a maximum Euclidean distance of an error associated with decoding one or more least significant bits.

2. The wireless communication device of claim 1, wherein the memory and the one or more processors, when performing the set partitioning operation, are configured to partition the QAM constellation set into a first QAM constellation subset and a second QAM constellation subset, wherein the first QAM constellation subset comprises a first half of the QAM constellation set and the second QAM constellation subset comprises a second half of the QAM constellation set.

3. The wireless communication device of claim 2, wherein a first channel code corresponds to the first QAM constellation subset and a second channel code corresponds to the second QAM constellation subset.

4. The wireless communication device of claim 1, wherein the memory and the one or more processors are further configured to decode the one or more least significant bits corresponding to the first QAM constellation subset based at least in part on applying a channel decoder only to the least significant bits.

5. The wireless communication device of claim 1, wherein the memory and the one or more processors, when processing the wireless communication signal, are configured to perform a plurality of digital post distortion iterations.

6. The wireless communication device of claim 5, wherein the memory and the one or more processors are further configured to:
   filter, from the wireless communication signal and based at least in part on the plurality of digital post distortion iterations, a non-linearity error associated with a power amplifier, to generate a filtered signal;
   determine that a signal-to-noise ratio (SNR) associated with the filtered signal satisfies an SNR condition; and estimate a transmitted symbol using a hard decision based at least in part on determining that the SNR satisfies the SNR condition.

7. The wireless communication device of claim 1, wherein the memory and the one or more processors are further configured to transmit a capability report that indicates that the wireless communication device comprises the digital post distortion receiver.

8. The wireless communication device of claim 1, wherein the memory and the one or more processors are further configured to receive a digital post distortion parameter indication that indicates a set partitioning type corresponding to the MLC set partitioning operation.

9. The wireless communication device of claim 8, wherein the digital post distortion parameter indication indicates a selected code rate.

10. The wireless communication device of claim 8, wherein the digital post distortion parameter indication is carried in downlink control information.

11. The wireless communication device of claim 1, wherein the wireless communication device comprises a user equipment.

12. The wireless communication device of claim 1, wherein the memory and the one or more processors are further configured to receive a capability report that indicates that the wireless communication device comprises the digital post distortion receiver.

13. The wireless communication device of claim 1, wherein memory and the one or more processors are further configured to transmit a digital post distortion parameter indication that indicates a set partitioning type corresponding to the MLC set partitioning operation.

14. The wireless communication device of claim 13, wherein the digital post distortion parameter indication indicates a selected code rate.

15. The wireless communication device of claim 1, wherein the wireless communication device comprises a base station.

16. An apparatus for wireless communication, comprising:
  means for receiving a wireless communication signal; and
  means for processing the wireless communication signal using a digital post distortion receiver comprising means for performing a multi-level coding (MLC) set partitioning operation, wherein the means for performing the MLC set partitioning operation comprise means for partitioning a quadrature amplitude modulation (QAM) constellation set by bounding a maximum Euclidean distance of an error associated with decoding one or more least significant bits.

17. The apparatus of claim 16, wherein the means for performing the set partitioning operation comprise means for partitioning the QAM constellation set into a first QAM constellation subset and a second QAM constellation subset,
  wherein the first QAM constellation subset comprises a first half of the QAM constellation set and the second QAM constellation subset comprises a second half of the QAM constellation set.

18. The apparatus of claim 17, wherein a first channel code corresponds to the first QAM constellation subset and a second channel code corresponds to the second QAM constellation subset.

19. The apparatus of claim 17, further comprising means for decoding the one or more least significant bits corresponding to the first constellation subset based at least in part on applying a channel decoder only to the least significant bits.

20. The apparatus of claim 16, wherein the means for processing the wireless communication signal comprises means for performing a plurality of digital post distortion iterations.

21. The apparatus of claim 20, further comprising:
  means for filtering, from the wireless communication signal and based at least in part on the plurality of digital post distortion iterations, a non-linearity error associated with a power amplifier, to generate a filtered signal;
  means for determining that a signal-to-noise ratio (SNR) associated with the filtered signal satisfies an SNR condition; and
  means for estimating a transmitted symbol using a hard decision based at least in part on determining that the SNR satisfies the SNR condition.

22. The apparatus of claim 16, further comprising means for transmitting a capability report that indicates that the apparatus comprises the digital post distortion receiver.

23. The apparatus of claim 16, further comprising means for receiving a digital post distortion parameter indication that indicates a set partitioning type corresponding to the MLC set partitioning operation.

24. The apparatus of claim 23, wherein the digital post distortion parameter indication indicates a selected code rate.

25. The apparatus of claim 23, wherein the digital post distortion parameter indication is carried in downlink control information.

26. The apparatus of claim 16, further comprising means for receiving a capability report that indicates that the apparatus comprises the digital post distortion receiver.

27. The apparatus of claim 16, further comprising means for transmitting a digital post distortion parameter indication that indicates a set partitioning type corresponding to the MLC set partitioning operation.

28. The apparatus of claim 27, wherein the digital post distortion parameter indication indicates a selected code rate.

29. A method of wireless communication performed by a wireless communication device, comprising:
  receiving a wireless communication signal; and
  processing the wireless communication signal using a digital post distortion receiver based at least in part on performing a multi-level coding (MLC) set partitioning operation, wherein performing the MLC set partitioning operation comprises partitioning a quadrature amplitude modulation (QAM) constellation set by bounding a maximum Euclidean distance of an error associated with decoding one or more least significant bits.

30. A non-transitory computer-readable medium storing a set of instructions for wireless communication, the set of instructions comprising:
  one or more instructions that, when executed by one or more processors of a wireless communication device, cause the wireless communication device to:
   receive a wireless communication signal; and
   process the wireless communication signal using a digital post distortion receiver based at least in part on performing a multi-level coding (MLC) set partitioning operation, wherein performing the MLC set partitioning operation comprises partitioning a quadrature amplitude modulation (QAM) constellation set by bounding a maximum Euclidean distance of an error associated with decoding one or more least significant bits.

* * * * *